US009438269B1

(12) United States Patent
Li et al.

(10) Patent No.: US 9,438,269 B1
(45) Date of Patent: Sep. 6, 2016

(54) ACCELERATING CODESET CONVERSION IN A COMPUTING ENVIRONMENT

(71) Applicant: International Business Machines Corporation, Armonk, NY (US)

(72) Inventors: Jian Li, Austin, TX (US); Zhuo Li, Cedar Park, TX (US); Su Liu, Austin, TX (US); Shunguo Yan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/842,868

(22) Filed: Sep. 2, 2015

(51) Int. Cl.
*H03M 7/00* (2006.01)
*H03M 7/02* (2006.01)
*H04L 29/08* (2006.01)
*H03M 7/28* (2006.01)

(52) U.S. Cl.
CPC .............. *H03M 7/02* (2013.01); *H03M 7/28* (2013.01); *H04L 67/10* (2013.01)

(58) Field of Classification Search
CPC .......... H03M 7/28; H03M 7/00; H03M 7/42; H04L 67/10
USPC ................................ 341/106, 50, 51, 126
See application file for complete search history.

(56) References Cited

U.S. PATENT DOCUMENTS

| | | | | |
|---|---|---|---|---|
| 4,876,541 A | * | 10/1989 | Storer | ................. H03M 7/3088 341/106 |
| 5,592,594 A | * | 1/1997 | Cahoon | ............... G06F 12/0875 345/501 |
| 5,929,792 A | * | 7/1999 | Herriot | ............... G06F 17/2217 341/55 |
| 6,704,816 B1 | | 3/2004 | Burke | |
| 7,552,415 B2 | | 6/2009 | Sanchez et al. | |
| 8,332,796 B2 | | 12/2012 | Osann, Jr. | |
| 8,606,051 B2 | * | 12/2013 | Wang | ................. H03M 1/1009 341/126 |
| 8,704,687 B2 | * | 4/2014 | Clissold | ................. H03M 7/02 341/106 |
| 2013/0125195 A1 | | 5/2013 | Lee et al. | |
| 2014/0035764 A1 | | 2/2014 | Clissold et al. | |

OTHER PUBLICATIONS

"Accelerate C in FPGA: Fast Prototyping, Fast Optimization, Fast Applications," Impulse Accelerated Technologies, Inc., www.ImpulseC.com, 2007, 2 pages.
Rotem, "C-to-Verilog.com: High-Level Synthesis Using LVLM," Haifa University, Nov. 2010, 35 pages.
Cox et al., "Ganglion-A Fast Field-Programmable Gate Array Implementation of a Connectionist Classifier," IEEE Journal of Solid-State Circuits, vol. 27, No. 3, Mar. 1992, pp. 288-299.
Anonymous, "A method for automatically loading a right conversion object from code set alias name," ip.com, IP.com No. 000205151, Mar. 16, 2011, 4 pages.
Edwards, "Microprocessors or FPGAs? Making the Right Choice," Technology in Context: FPGAs and CPUs: Allies or Rivals?, reprinted from Feb. 2011 RTC Magazine, 3 pages.

\* cited by examiner

*Primary Examiner* — Jean B Jeanglaude
(74) *Attorney, Agent, or Firm* — Teddi E. Maranzano; Joseph Petrokaitis

(57) ABSTRACT

A method for accelerating codeset conversion in a computing environment is provided. The method may include, among other things, receiving one or more requests for codeset conversion. The one or more requests may be received, for example, from a client over a communications network. A change in the one or more requests for codeset conversion may be detected. In response to detecting the change, a subset of codeset converters may be selected from among a library of codeset converters to be included in a codeset conversion accelerator. The codeset conversion accelerator may be, among other things, reprogrammed with selected subset of codeset converters. The one or more received requests may be subsequently rerouted to the reprogrammed codeset conversion accelerator.

20 Claims, 10 Drawing Sheets

ACCELERATING CODESET CONVERSION IN A COMPUTING ENVIRONMENT

BACKGROUND

The present invention generally relates to computer communications, and more particularly, to accelerating requests for codeset conversion in a computing environment.

A codepage or codeset may refer to a table of values that describe a character set for encoding a particular language. For example, according to the Unicode/UTF-8 codeset standard, the registered trademark symbol '®' is represented by Unicode code value U+00AE. However, within the GB18030 codeset standard, the symbol '®' is represented by GB18030 code value 0x81308533. Accordingly, a codeset converter would convert the code value (e.g., U+00AE) for a character (e.g., ®) in one codeset standard (e.g., Unicode) to another code value (e.g., 0x81308533) for the same character (e.g., ®) in another codeset standard (e.g., GB18030) using, for example, a codeset mapping table. Generally, codeset converters may be stored as part of a library with thousands or more codeset converters. Accordingly, it may be, among other things, time-intensive to select the correct codeset converter for conversion and carry out the codeset conversion.

BRIEF SUMMARY

According to one exemplary embodiment, a method for accelerating codeset conversion in a computing environment is provided. The method may include, among other things, receiving one or more requests for codeset conversion. The one or more requests may be received, for example, from a client over a communications network. A change in the one or more requests for codeset conversion may be detected. In response to detecting the change, a subset of codeset converters may be selected from among a library of codeset converters to be included in a codeset conversion accelerator. The codeset conversion accelerator may be, among other things, reprogrammed with selected subset of codeset converters. The one or more received requests may be subsequently rerouted to the reprogrammed codeset conversion accelerator.

According to another exemplary embodiment, a computer program product for accelerating codeset conversion in a computing environment is provided. The computer program product may include a computer-readable storage device and program instructions stored on one or more tangible storage devices. The program instructions are executable by a processor for performing a method that may accordingly include, among other things, receiving one or more requests for codeset conversion. The one or more requests may be received, for example, from a client over a communications network. A change in the one or more requests for codeset conversion may be detected. In response to detecting the change, a subset of codeset converters may be selected from among a library of codeset converters to be included in a codeset conversion accelerator. The codeset conversion accelerator may be, among other things, reprogrammed with selected subset of codeset converters. The one or more received requests may be subsequently rerouted to the reprogrammed codeset conversion accelerator.

According to another exemplary embodiment, a computer system for accelerating codeset conversion in a computing environment is provided. The computer system may include one or more processors, one or more computer-readable memories, one or more computer-readable tangible storage devices, and program instructions stored on at least one of the one or more storage devices for execution by at least one of the one or more processors via at least one of the one or more memories. The computer system is capable of performing a method that may accordingly include, among other things, receiving one or more requests for codeset conversion. The one or more requests may be received, for example, from a client over a communications network. A change in the one or more requests for codeset conversion may be detected. In response to detecting the change, a subset of codeset converters may be selected from among a library of codeset converters to be included in a codeset conversion accelerator. The codeset conversion accelerator may be, among other things, reprogrammed with selected subset of codeset converters. The one or more received requests may be subsequently rerouted to the reprogrammed codeset conversion accelerator.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
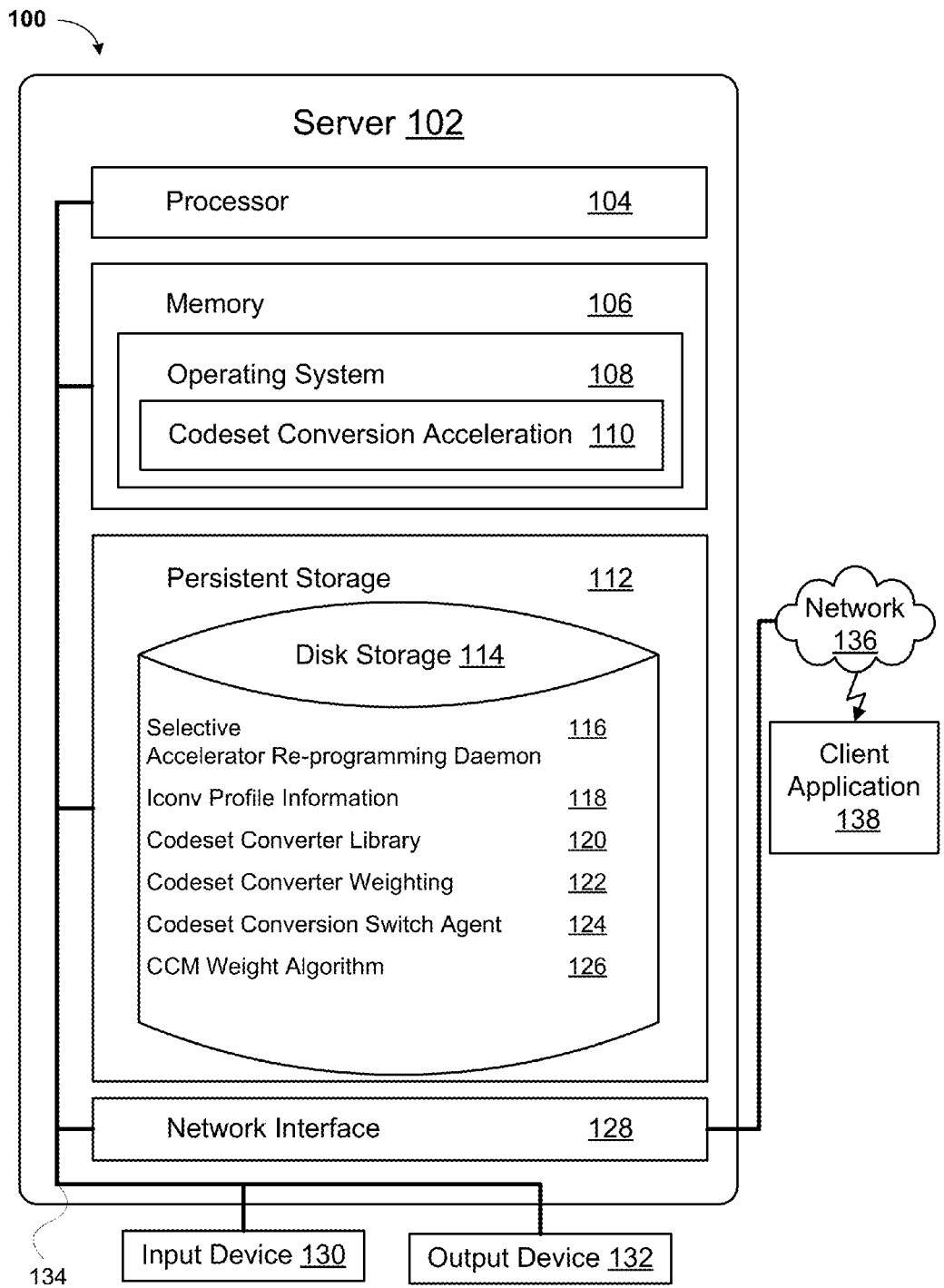
FIG. 1A is a computer system operable for codeset conversion acceleration according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The one or more exemplary embodiments described herein accelerate codeset conversion within a computer environment (e.g., OpenPower architecture, cloud computing environment, etc.). The codeset conversion acceleration may utilize a codeset conversion acceleration appliance (e.g., a field-programmable gate array (FPGA) or graphics processing unit (GPU)) that may have, among other things, improved throughput, energy efficiency, and speed over standard CPU-based codeset conversion. The codeset conversion acceleration appliance may be designed to dynamically select and upload the most-used (e.g. the most important, most frequently used, and/or most requested) codeset converters from among a library of thousands of codeset converters on the basis of different user-based criteria, such as, but not limited to, language (e.g., English, Japanese, Chinese, etc.), geographical location (e.g., North America, Asia, etc.), and computing platform (e.g., personal computer, storage server, push server, etc.).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 1A, a computer system 100 operable for codeset conversion acceleration according to an exemplary embodiment is depicted. Computer system 100 may contain a server 102 that may provide, among other things, Codeset Conversion Acceleration (CCA) 110. The server 102 may additionally be connected to other computers and servers via a network 136. The network 136 may include connections, such as wire, wireless communication links, or fiber optic cables.

Server 102 may include, among other things, a processor 104 that executes instructions for software, for example the operating system (OS) 108 and CCA 110 (discussed in further detail with respect to FIG. 1B) that may be loaded into a memory 106. The processor 104 may be a set of one or more processors or may be a multi-processor core, depending on the particular implementation. Furthermore, the processor 104 may be connected, via a bus 134 or the like, to, among other things, memory 106, a network interface device 128, a disk storage 114, a persistent storage 112, an input device 130, and an output device 132.

The server 102 is generally under the control of OS 108 (e.g., Linux, Windows, AIX, etc.). However, it may be appreciated that any operating system supporting the functions disclosed herein may be used. The processor 104 is included to be representative of a single CPU, multiple CPUs, a single CPU having multiple processing cores, and the like. Similarly, the memory 106 may be a random access memory. While the memory 106 is shown as a single identity, it should be understood that the memory 106 may comprise a plurality of modules, and that the memory 106 may exist at multiple levels, from high speed registers and caches to lower speed but larger formats. The network interface device 128 may be any type of network communications device allowing the server 102 to communicate with other computers, including the client application 138, via a network 136 or other communications network (i.e., the Internet). While the client application 138 is shown as a single identity, it should be understood that the client application 138 may comprise a plurality of clients in communication with server 102 over network 136.

Persistent storage 112 may be any device or hardware that is capable of storing information, such as, data, OS 108, and program instructions, including those providing CCA 110. Persistent storage 112 may accordingly take various forms depending on the particular implementation. For example, persistent storage 112 may be, among other things, disk storage 114, a flash memory, optical disk, magnetic tape, cloud storage devices, or some combination of the above.

Instructions for the OS 108, CCA 110, applications and/or programs may be located in persistent storage 112, which may communicate with processor unit 104 through the bus 134. The instructions may be in a functional form on persistent storage 112. Additionally, these instructions may be loaded into memory 106 for execution by processor unit 104.

The input device 130 may be any device for providing input to the server 102 (e.g., a keyboard, mouse, etc.). Additionally, the output device 132 may be any device for providing output to a user of the server 102. Although shown separately from the input device 132, the output device 132 and input device 130 may be combined to form a single unit (e.g., a display screen with an integrated touch-screen, etc.).

As will be discussed with reference to FIG. 7, the server 102 and the computer hosting the client application 138 may include one or more internal components 800 and one or more external components 900.

Figure 1B:
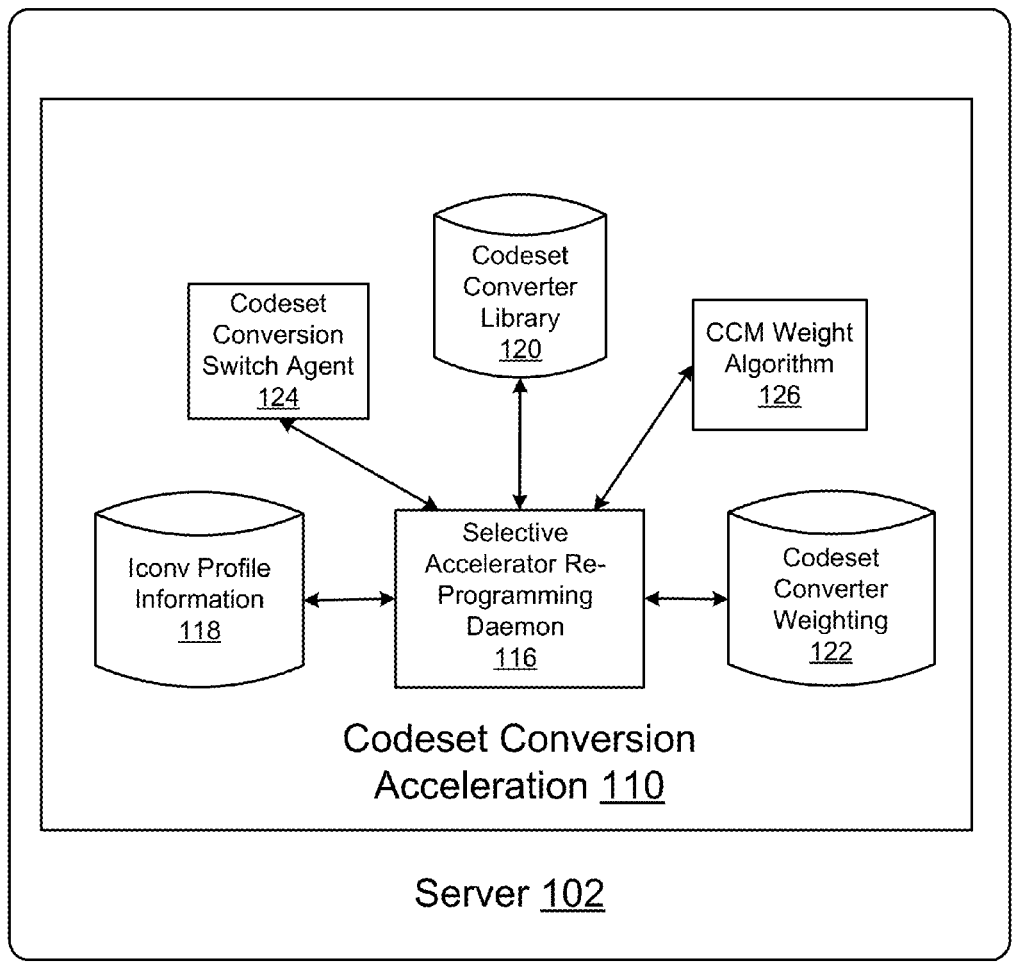
FIG. 1B is a schematic block diagram corresponding to component and algorithms associated with codeset conversion acceleration according to an exemplary embodiment.

FIG. 1B illustrates one or more components and algorithms associated with CCA 110 running on the server 102 as depicted in FIG. 1A, according to one exemplary embodiment. As used herein, CCA 110 (FIGS. 1A, 1B) includes functionality that the operating system performs on behalf of CCA 110, such as retrieving environment variables, and reading files.

A selective accelerator re-programming daemon 116, may take as input, among other things, iconv profile information 118 and a codeset converter weighting 122 to determine which codeset converters from among a codeset converter library 120 may be selected to accelerate codeset conversion in a computing environment. Codeset conversion acceleration 110 may be shown and described through an algorithm, configuration rules, and components that are specialized for performing codeset conversion. However, it may be appreciated that codeset conversion acceleration 110 may be embodied in components and reconfiguration rules other than those described. Additionally, selective accelerator re-programming daemon 116 may be coupled to a codeset conversion switch agent 124 and a codeset conversion modeler (CCM) weight algorithm 126.

Codeset converter library 120 may include one or more codeset converters and an iconv( ) function. The iconv( ) function may, among other things, convert a buffer of characters specified by an inbuf parameter from one coded character set identifier (CCSID) into another CCSID and store the converted characters into a buffer specified by an outbuf parameter. The inbuf parameter may point to a variable that points to the first character in the input buffer. Additionally, the outbuf parameter may point to a variable that points to the first available byte in the output buffer. The CCSIDs used are those in a conversion descriptor, cd, which may returned from a call to either an iconv_open( ) or an QtqIconvOpen( ) function.

On input, an inbytesleft parameter may indicate a number of bytes in inbuf to be converted. Similarly, an outbytesleft parameter may indicates a number of bytes available in outbuf. These values may be, among other things, decremented when conversion is done, such that on return they may indicate a state of their associated buffers. For encodings dependent on shift state, iconv( ) may change the shift state of the conversion descriptor to match the shift state at the end of the input buffer. For subsequent calls to iconv( ) conversion may begin using the current shift state of the conversion descriptor. Additionally, codeset converter library 120 may receive one or more appropriate parameters from iconv profile information 118. Thus, the iconv( ) function provides an application programming interface (API) for codeset conversion.

Codeset conversion switch agent 124 may, among other things, reroute the received requests from client application 138 over network 136 to an appropriate codeset converter. Codeset conversion switch agent 124 may route requests to codeset converter library 120, where it may be converted using the iconv( ) API. Alternatively, codeset conversion switch agent 124 may route one or more requests from client 138 to a hardware codeset conversion accelerator.

CCM weight algorithm 126 may be used to calculate one or more weight values for the codeset converters in codeset converter library 120. By way of example and not of limitation, CCM weight algorithm 126 may be, among other things, of the form $f(ccm_w)=aX_1+bX_2+cX_3+ \ldots +zX_n$. Coefficients a, b, c, etc. may be predetermined and stored in codeset converter weighting 122. Additionally, $X_1, X_2, X_3$, etc. may include but is not limited to language information, locale information, geolocation information, a number of calls for specific codeset converters, one or more predefined weight values for the codeset converters, and information associated with iconv profile information 118. CCA 110 may optionally store the calculated codeset conversion weights in codeset converter weighting 122 for future use.

Figure 2A:
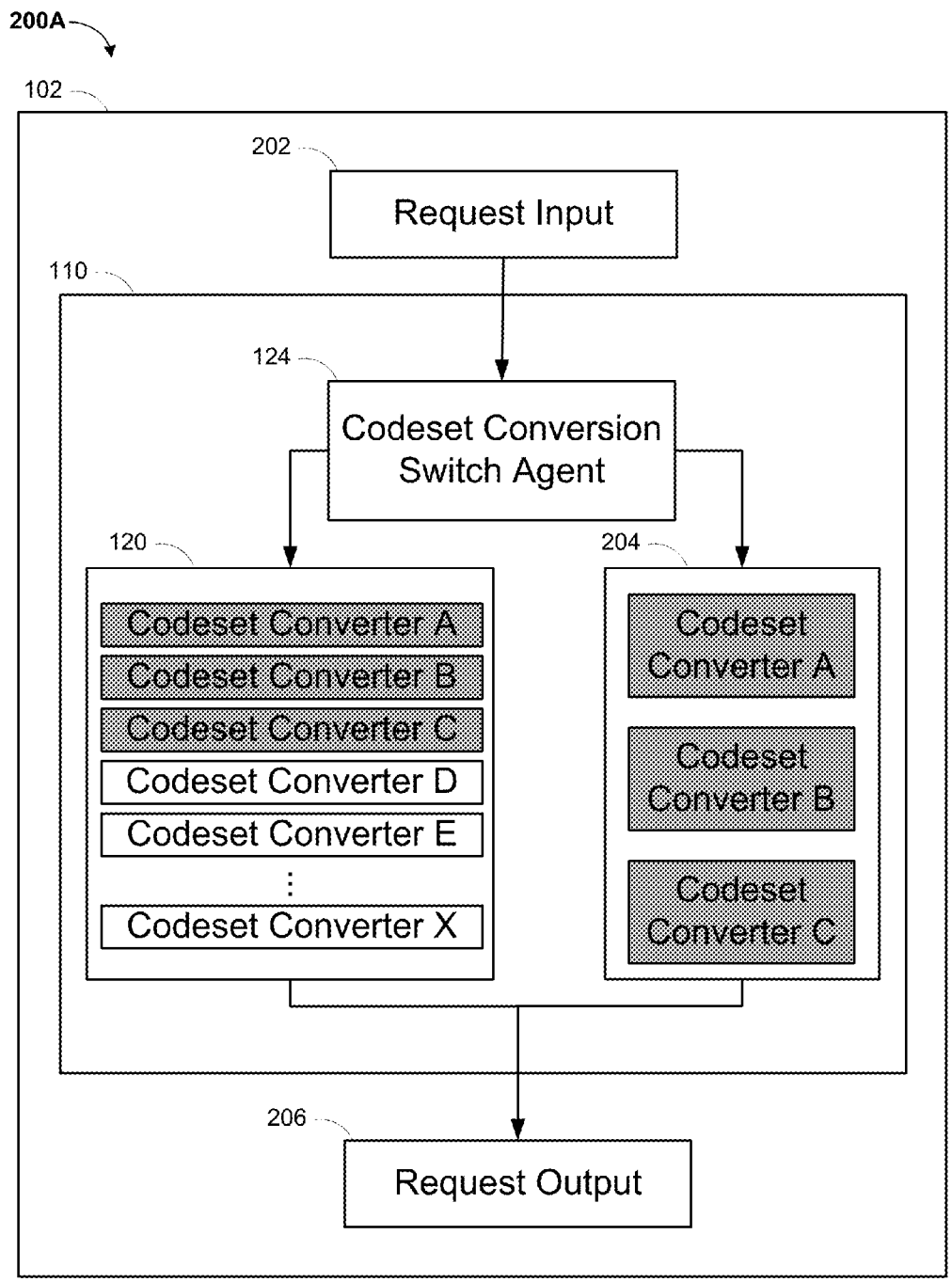
FIGS. 2A-2C are block diagrams depicting the operation of a Codeset Converter Acceleration (CCA) system according to an exemplary embodiment.
Figure 2B:
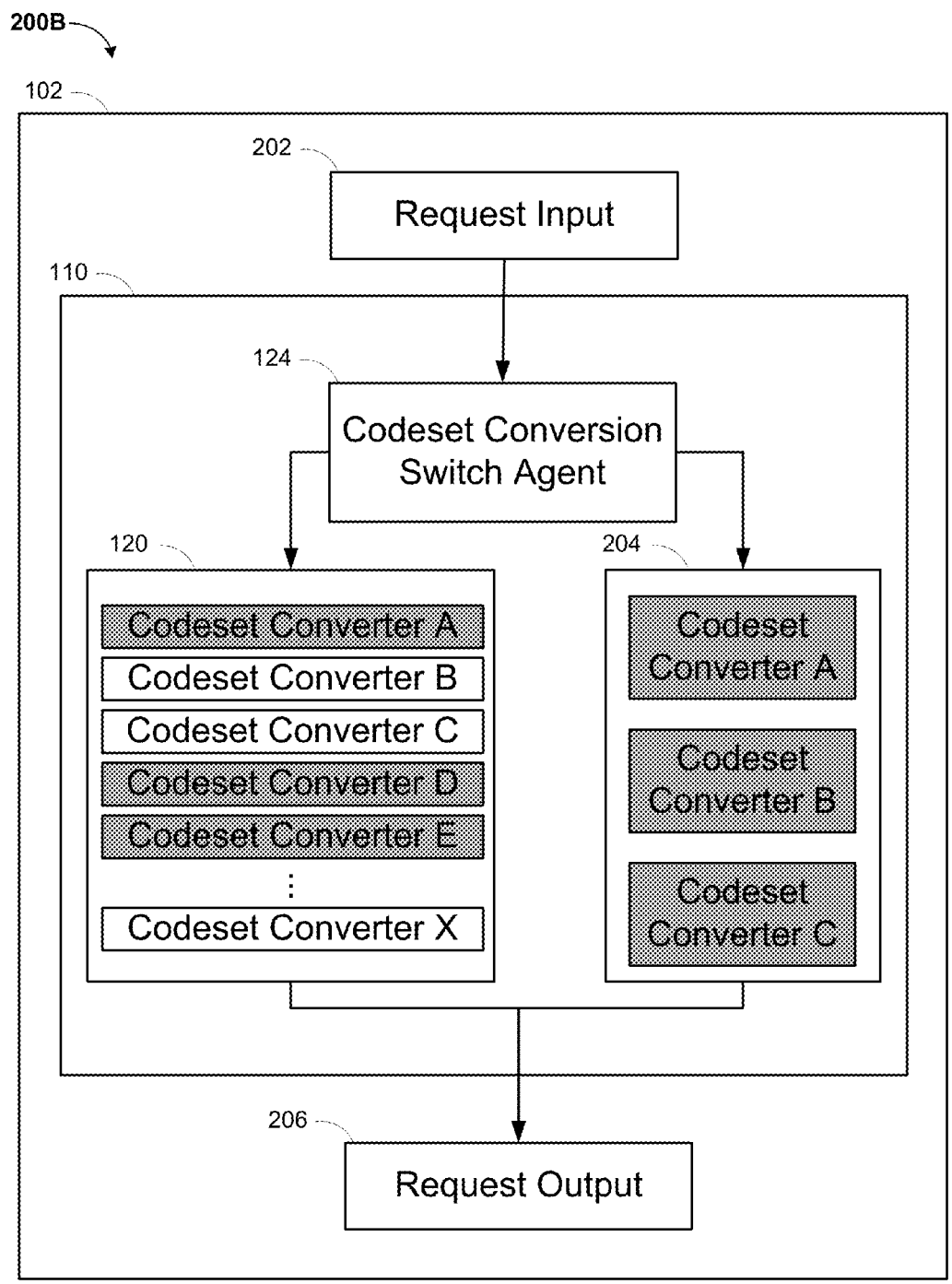
Figure 2C:
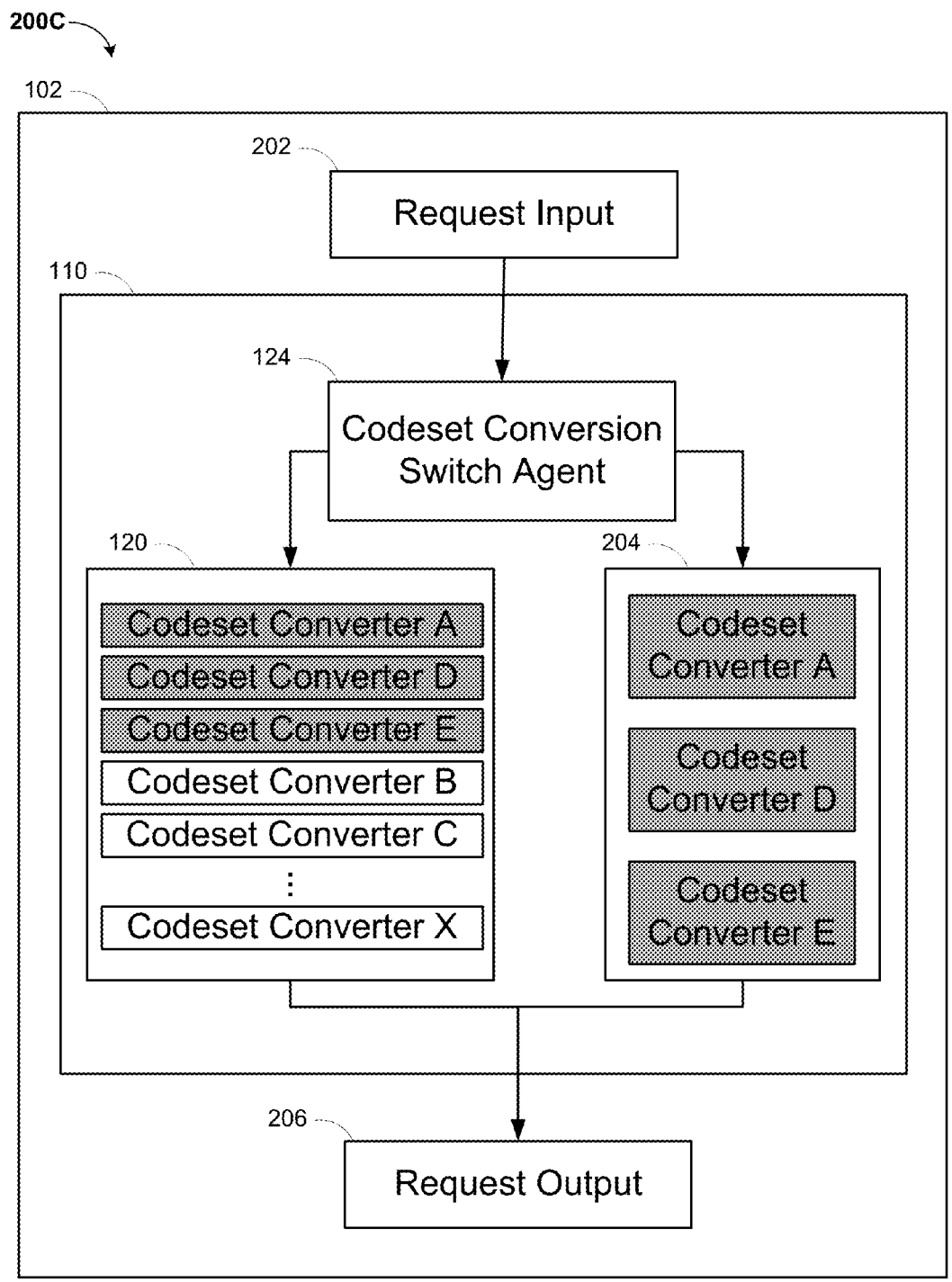

FIGS. 2A-2C depict the operation of a Codeset Converter Acceleration (CCA) system according to an exemplary embodiment. FIGS. 2A-2C may be described with the aid of the exemplary embodiments of FIGS. 1A-1B.

FIG. 2A depicts a schematic block diagram 200A of a CCA system on server 102 (FIGS. 1A-1B), according to an exemplary embodiment. The CCA system may include, among other things, a request input 202, CCA 110 (FIGS. 1A-1B), and a request output 206. CCA 110 may further include a codeset conversion switching agent 124 (FIGS. 1A-1B), a codeset converter library 120 (FIGS. 1A-1B), and a codeset conversion acceleration appliance 204. Codeset converter library 120 may contain a plurality of Codeset Converters A-X. Additionally, codeset conversion acceleration appliance 204 may contain one or more codeset converters (e.g., Codeset Converters A, B, and C), which may be identified as, among other things, the most-used (i.e., the most important, most frequently used, and/or most requested) codeset converters from among the codeset converter library 120. Codeset conversion acceleration appliance 204 may be, among other things, a field-programmable gate array (FPGA), graphics processing unit (GPU), or any architecture capable of parallel-processing requests for codeset conversion. It may be appreciated that codeset conversion acceleration appliance 204 may contain any number of the most-used codeset converters based on the one or more requests received through request input 202. It may be further appreciated that the codeset converters on codeset conversion acceleration appliance 204 are substantially the same or similar to one or more codeset converters from among codeset converter library 120. In operation, the server 102 may receive one or more requests through request input 202. CCA 110 may, among other things, route the received requests, using codeset conversion switch agent 124, to codeset converter library 120 or codeset conversion acceleration appliance 204 for codeset conversion. The requests may then be output by request output 206.

FIG. 2B is a schematic block diagram 200B illustrating a change in the codeset converters identified in FIG. 2A as the most-used codeset converters. The change may accordingly include, among other things, a change in the language, locale, or geolocation of the received requests; a change in a number of calls for specific codeset converters; or a change to one or more predefined weight values for the codeset converters. In operation, CCA 110 located on server 102 may detect a change to the requests received by request input 202. In response to detecting this change, one or more weight values may be calculated for the codeset converters stored in codeset converter library 120. The weight values may be, among other things, determined using the changes to the requests detected by server 102. Additionally, the weight values may be compared against one or more previously calculated weight values saved in codeset converter weighting 122 (FIGS. 1A-1B) stored in memory and may, in turn, be stored in codeset converter weighting 122, thus allowing the weight values to be configurable. Upon detecting the change in requests received through request input 202, server 102 may identify, for example, Codeset Converters A, D, and E, for example, may be identified as the new most-used codeset converters.

FIG. 2C is a schematic block diagram 200C of a dynamic response to the change in the most-used codeset converters of the CCA system depicted in FIG. 2B. The CCA system may, among other things, reprogram the new set of most-used codeset converters (i.e., Codeset Converters A, D, and E) onto the codeset conversion accelerator. In operation, codeset conversion acceleration appliance 204 may be reprogrammed with Codeset Converters A, D, and E. It may be appreciated that one or more codesets from among codeset converter library 120 that may already be programmed to codeset conversion acceleration appliance 204 need not be reprogrammed a subsequent time. For example, CCA 110 on server 102 may detect Codeset Converter A may be located on codeset conversion acceleration appliance 204 and therefore may not remove Codeset Converter A to obviate the need to reprogram codeset conversion acceleration appliance 204 with Codeset Converter A for a second time. Codeset conversion switch agent 124 may accordingly reroute requests for codeset conversion associated with Codeset Converters A, D, and E to codeset conversion acceleration appliance 204. Alternatively, codeset conversion switch agent 124 may route requests received through request input 202 associated with codeset converters not programmed to codeset conversion acceleration appliance 204 to codeset converter library 120. Upon conversion, codeset converter library 120 and codeset conversion acceleration appliance 204 may output the converter requests to request output 206.

Figure 3:
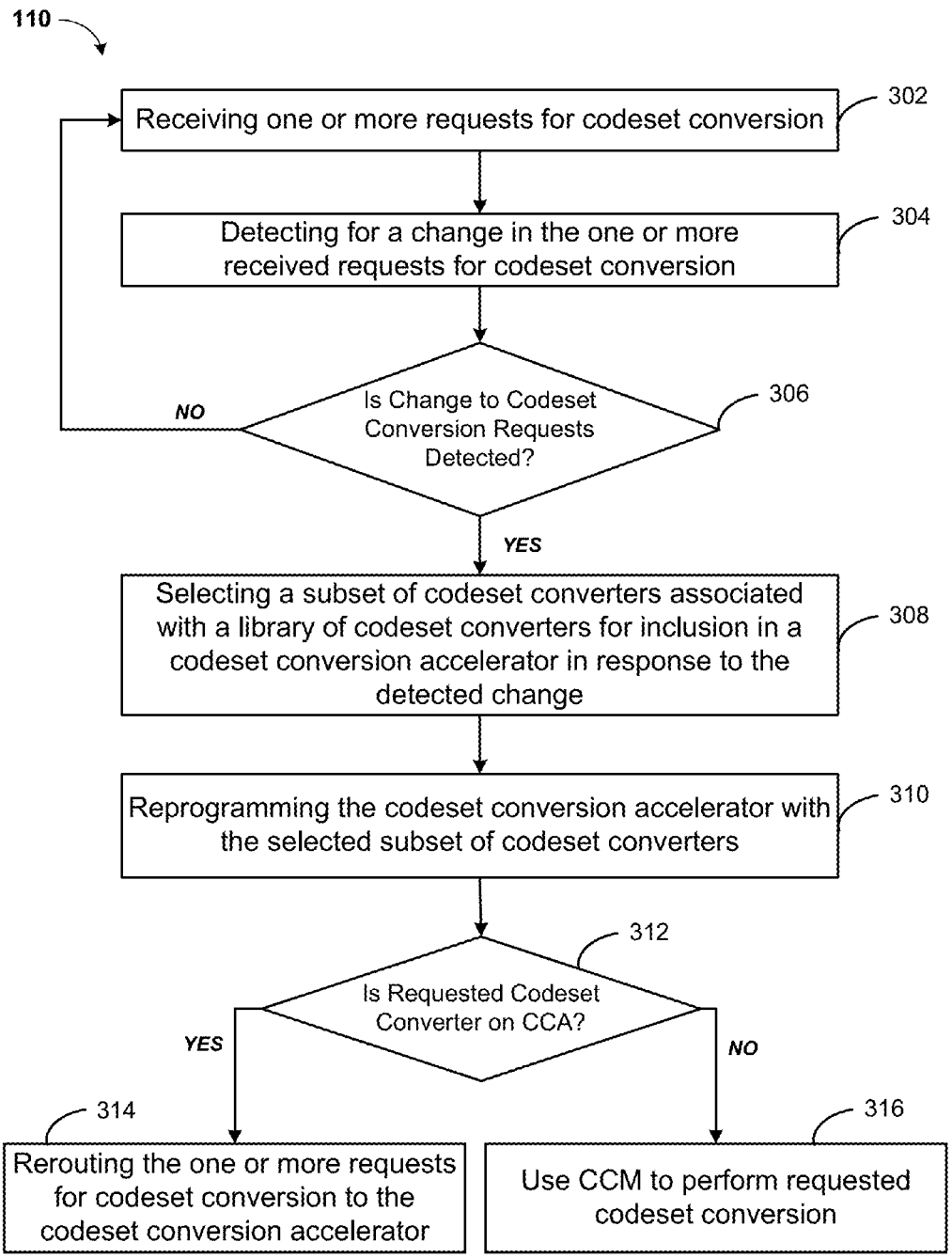
FIG. 3 is an operational flow chart corresponding to a CCA program according to an exemplary embodiment.

FIG. 3 is an operational flow chart corresponding to Codeset Conversion Acceleration 110 (FIG. 2) associated with the exemplary embodiment depicted in FIG. 2. CCA 110 of FIG. 3 may be described with the aid of the exemplary embodiments of FIG. 1A, FIG. 1B, and FIGS. 2A-2C.

At 302, one or more requests for codeset conversion is received. As previously discussed, the one or more requests may be received from one or more client applications connected over a network. Alternatively, the one or more requests may also be received from within the same computing environment. In operation, request input 202 (FIGS. 2A-2C) on server 102 (FIGS. 2A-2C) may receive one or more requests for codeset conversion from client application 138 (FIG. 1A) via network 136 (FIG. 1A). CCA 110 may then direct the request to codeset conversion switch agent 124 (FIGS. 2A-2C) for, among other things, routing to the appropriate converter.

At 304, a change in the one or more received requests for codeset conversion is detected. For example, CCA 110 may monitor requests received from client application 138 (FIG. 1A) over network 136 (FIG. 1A) in order to detect, among other things, a change associated with the one or more requests. A change in one or more requests for codeset conversion may be considered to be, among other things, a change in the language, locale, or geolocation of the received requests; a change in a number of calls for specific codeset converters; or a change to one or more predefined weight values for the codeset converters. CCA 110 may perform the monitoring of client application 138 by polling network 136 to detect a change in the received requests. For example, in some implementations, CCA 110 may reside within the operating system 108 (FIG. 1A). Further, a daemon associated with operating system 108 may be used by the CCA 110 to monitor for the change to the requests.

At 306, a change to one or more requests for codeset conversion is detected for. In operation, client application 138 (FIG. 1A) may send one or more requests for codeset conversion that may utilize, for example, Codeset Converter C (FIG. 2A). Subsequently, client application 138 may later send one or more requests for codeset conversion that may utilize for example, Codeset Converter D (FIG. 2B). Thus CCA 110 may detect a change in the language and locale of the received requests. If, however, a change is not detected, CCA 110 may continue to receive requests for codeset conversion and monitor for a change.

At 308, if a change to the received requests for codeset conversion is detected, a subset of codeset converters associated with a library of codeset converters is selected for inclusion within a codeset conversion accelerator. It may be appreciated that the subset of codeset converters may be selected by calculating one or more weight values for each of the codeset converters from among the library of codeset converters and comparing the calculated weight values to one or more stored weight values. In an alternative embodiment, the subset of codeset converters may be specified manually. In operation, CCA 110 may, upon detecting the received requests from client application 138 (FIG. 1A) via request input 202 (FIG. 2B), may, among other things, select one or more codeset converters (for example, Codeset Converters A, D, and E) for inclusion in codeset conversion acceleration appliance 204 (FIG. 2B).

At 310, the codeset converter accelerator is reprogrammed with the selected subset of codeset converters. The selected subset of codeset converters may be the most-used codeset converters from among the library of codeset converters. Thus, reprogramming the codeset converter accelerator with the selected subset of codeset converters may allow conversion of one or more requested associated with the selected codeset converters to be, for example, faster and more energy-efficient. In operation, CCA 110 (FIGS. 2A-2C) may direct the selective accelerator reprogramming daemon 116 (FIGS. 1A-1B) to program Codeset Converters D and E (FIG. 2C) to codeset conversion acceleration appliance 204 (FIG. 2C). It may be appreciated that selective accelerator re-programming daemon 116 may restrict the programming of one or more codeset converters previously programmed to codeset conversion acceleration appliance 204 in order to, among other things, prevent deletion and subsequent reprogramming of, for example, Codeset Converter A.

At 312, the codeset converter switch agent determines whether the received requests are associated with a codeset converter programmed to the codeset converter accelerator. For example, one or more received requests may utilize a codeset converter programmed to the codeset conversion accelerator and may, therefore, be routed to the codeset conversion accelerator for codeset conversion. Conversely, one or more received requests may utilize a codeset converter not programmed to the codeset conversion accelerator and may, therefore, be routed to the standard codeset conversion library.

At 314, if the requested codeset converter is on the codeset converter accelerator, the request is rerouted to the codeset converter accelerator. In operation, CCA 110 (FIGS. 2A-2C) may receive a request from request input 202 (FIGS. 2A-2C) that may use Codeset Converter A. Thus, CCA 110 may, among other things, direct codeset conversion switch agent 124 (FIGS. 2A-2C) to route the received request to codeset conversion acceleration appliance 204 (FIGS. 2A-2C) for codeset conversion.

At 316, if the requested codeset converter is not on the codeset converter accelerator, the received request is converted by the CCM. In operation, CCA 110 (FIGS. 2A-2C) may receive a request from request input 202 (FIGS. 2A-2C) that may use Codeset Converter X (FIGS. 2A-2C). Thus, CCA 110 may, among other things, direct codeset conversion switch agent 124 (FIGS. 2A-2C) to route the received request to codeset converter library 120 (FIGS. 2A-2C) for codeset conversion.

Figure 4:
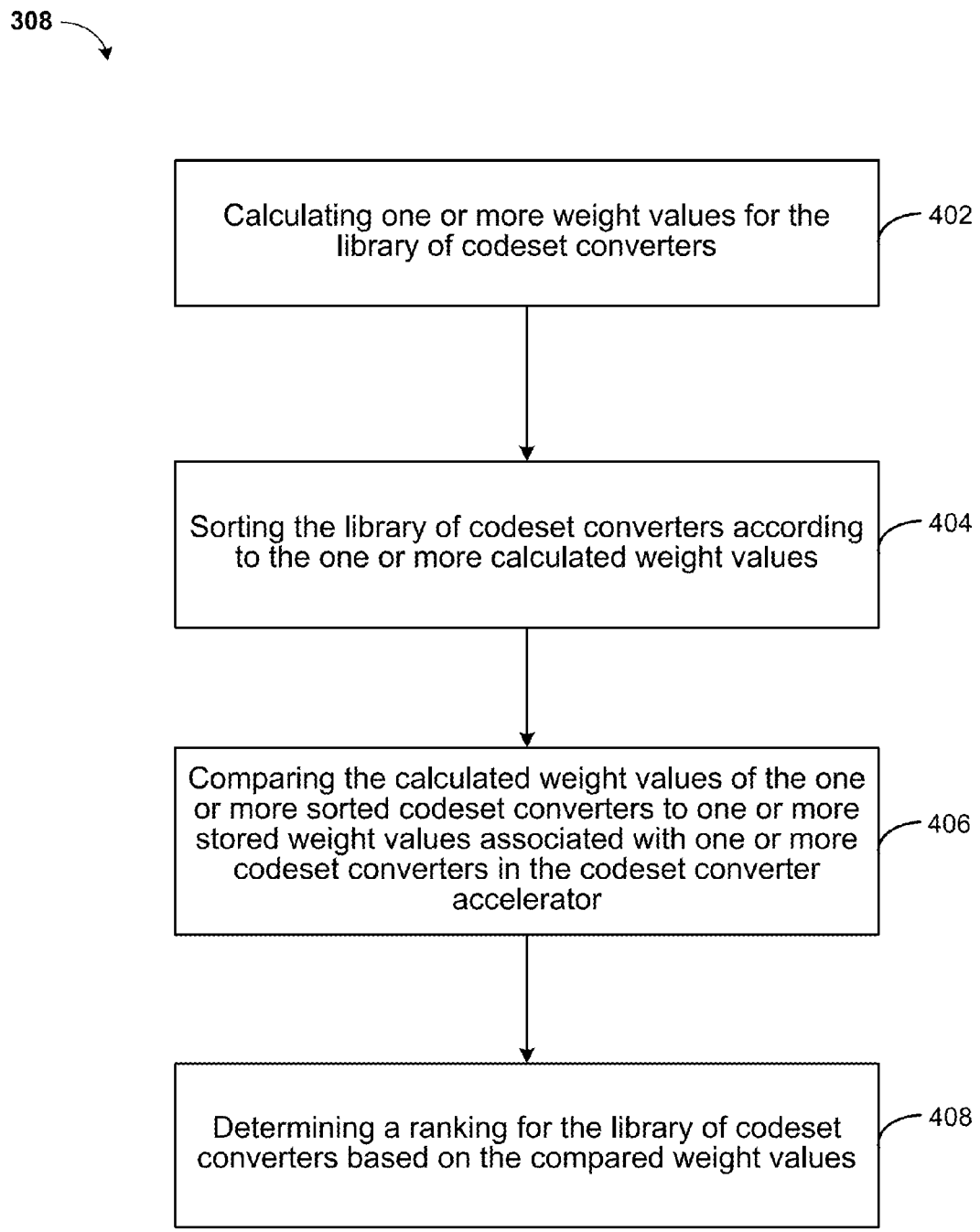
FIG. 4 is an operational flow chart corresponding to a codeset selecting process utilized by a CCA program according to an exemplary embodiment.

FIG. 4 depicts an exemplary operational flow chart describing the codeset selecting process 308 within the operational flow chart of the CCA 110 of FIG. 3. FIG. 4 is described with the aid of the exemplary embodiments of FIG. 1A, FIG. 1B, and FIGS. 2A-2C.

At 402, one or more weight values for the library of codeset converters is calculated. As previously discussed, one or more weight values may be calculated for the codeset converters stored in the library of codeset converters. The weight values may be, among other things, determined using the changes to the requests. Additionally, the weight values may be compared against one or more previously calculated weight values stored in memory and may, in turn, be stored in memory. In operation, CCA 110 (FIGS. 2A-2C) on server 102 (FIGS. 2A-2C) may use CCM weight algorithm 126 (FIGS. 1A-1B) to calculate one or more stored weight values.

At 404, the library of codeset converters is sorted according to the one or more calculated weight values. The sorting may be based on, among other things, the calculated weight values for the library of codeset converters. In operation, CCA 110 (FIGS. 2A-2C) may direct codeset converter library 120 (FIGS. 2A-2C) to sort the one or more codeset converters. CCA 110 may detect Codeset Converter A (FIGS. 2A-2C), for example, has the highest weight value and may subsequently sort it to a front position within codeset converter library 120. Additionally, CCA 110 may detect Codeset Converter X (FIGS. 2A-2C), for example, has the lowest weight value and may subsequently sort it to an end position within codeset converter library 120.

At 406, the calculated weight values of the one or more sorted codeset converters are compared to one or more stored weight values associated with one or more codeset converters in the codeset converter accelerator. In operation, CCA 110 (FIGS. 2A-2C) may compare the weight values calculated by CCM weight algorithm 126 (FIGS. 1A-1B) to one or more previously calculated weight values stored in codeset converter weighting 122 (FIGS. 1A-1B). Accordingly, one or more weight values may have a higher or lower weight value from the previously stored weight values as a result of the change to the one or more requests received from client application 138 (FIG. 1A) over network 136 (FIG. 1A) via request input 202 (FIGS. 2A-2C).

At 408, a ranking is determined for the library of codeset converter based on the compared weight values. For example, a codeset converter having the highest weight value may be, among other things, given the greatest ranking and may, therefore, be selected to be programmed to the codeset conversion accelerator. In operation, CCA 110 (FIGS. 2A-2C) may determine Codeset Converter A, for example, has the greatest weight value and may select Codeset Converter A for programming to codeset conversion acceleration appliance 204 (FIGS. 2A-2C).

Figure 5:
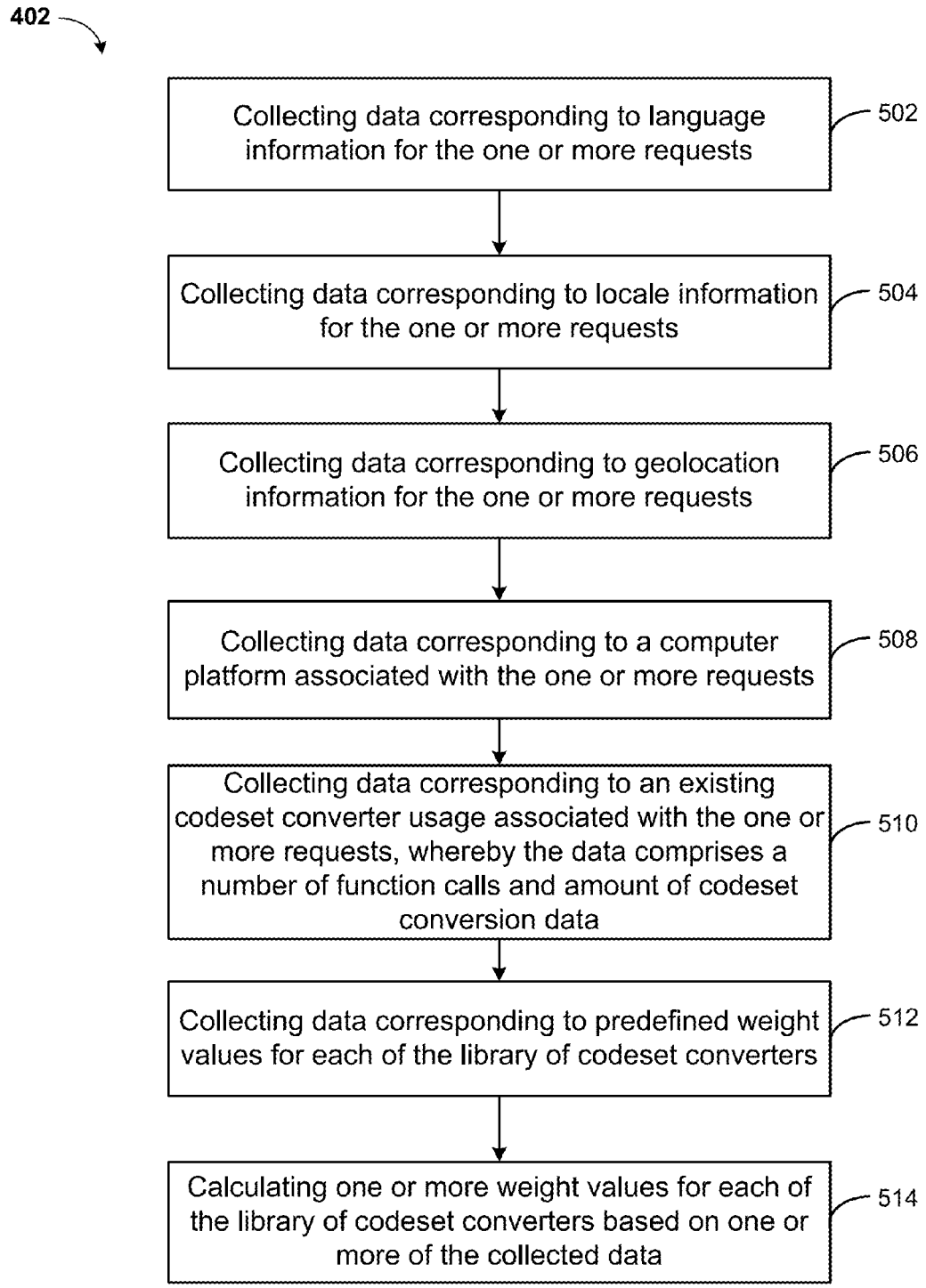
FIG. 5 is an operational flow chart corresponding to a weight value calculating process utilized by a CCA program according to an exemplary embodiment.

FIG. 5 is an operational flow chart corresponding to a weight value calculating process utilized by CCA 110 according to an exemplary embodiment. FIG. 5 is described with the aid of the exemplary embodiments of FIG. 1A, FIG. 1B, and FIGS. 2A-2C.

At 502, data corresponding to language information for the one or more requests is collected. Non-limiting exemplary language information may include, among other things, information corresponding to a language associated with a source codeset for conversion, a language associated with a target codeset for conversion, and a default language associated with the received requests. In operation, CCA 110 (FIGS. 2A-2C) on server 102 (FIGS. 2A-2C) may receive a request from client application 138 (FIG. 1A) via request input 202 (FIGS. 2A-2C) for conversion from, for example, GB18030 to UTF-8. Thus, CCA 110 may detect, among other things, a language associated with client application 138, a language for the source codeset (i.e., Chinese for GB18030), and a language for the target codeset (i.e., English for UTF-8). Additionally, CCA 110 may determine the language information by, among other things, analyzing metadata from the one or more requests received through request input 202. Alternatively, CCA 110 may determine the language information by polling client application 138 directly.

At 504, data corresponding to locale information for the one or more requests is collected. It may be appreciated that the process of collecting the locale information data is substantially similar to the process of collecting language information data, as discussed above. For example, non-limiting exemplary locale information data may include, among other things, information corresponding to language and culture settings, running codeset converters, and default languages.

At 506, data corresponding to geolocation information for the one or more requests is collected. It may be appreciated that the process of collecting the geolocation information data is substantially similar to the process of collecting language information data, as discussed above. For example, non-limiting exemplary geolocation information data may include, among other things, information corresponding a user's physical location, country data, and province data.

At 508, data corresponding to computing platform information for the one or more requests is collected. It may be appreciated that the process of collecting the computing platform information data is substantially similar to the process of collecting language information data, as discussed above. For example, non-limiting exemplary computing platform information data may include, among other things, information corresponding to operating system names, releases, and versions; running and installed codeset converters; running and installed applications; user profiles and related information; application profiles; platforms of connected clients and servers; and major encodings of inbound and outbound data.

At 510, data corresponding to existing codeset converters for the one or more requests is collected. It may be appreciated that the process of collecting the existing codeset converter data information data is substantially similar to the process of collecting language information data, as discussed above. For example, non-limiting exemplary existing codeset converter data may include, among other things, data corresponding to codeset converter usage associated with the one or more requests, data corresponding to encoding standards associated with inbound data and outbound data associated with the one or more requests, data corresponding to the number of function calls for one or more codeset converters, and data corresponding to an amount of codeset conversion data associated with one or more codeset converters.

At 512, data corresponding to predefined weight values for each of the library of codeset converters is collected. One or more codeset converters from among the library of codeset converters may be, for example, manually assigned the highest weight value and may, therefore, be included in the codeset converter accelerator. Alternatively, the predefined weight values may be determined from previously calculated weight values. It may be appreciated that the process of collecting the predefined weight values is substantially similar to the process of collecting language information data, as discussed above.

At 514, one or more weight values for each of the library of codeset converters is calculated based on one or more of the collected data. As previously discussed, one or more weight values may be calculated for the codeset converters stored in the codeset converter library. The weight values may be, among other things, determined using the changes to the requests. Additionally, the weight values may be compared against one or more previously calculated weight values stored in memory and may, in turn, be stored in memory. In operation, CCA 110 (FIGS. 2A-2C) on server 102 (FIGS. 2A-2C) may use CCM weight algorithm 126 (FIGS. 1A-1B) to calculate one or more stored weight values. By way of example and not of limitation, CCM weight algorithm 126 may be, among other things, of the form $f(ccm_w)=aX_1+bX_2+cX_3+ \ldots +zX_n$. Coefficients a, b, c, etc. may be preconfigured and stored in codeset converter weighting 122 (FIGS. 1A-1B). Alternatively, coefficients a, b, c, etc. may be reconfigured, such as by client application 138 (FIG. 1A) over network 136 (FIG. 1A). Additionally, $X_1$, $X_2$, $X_3$, etc. may include but are not limited to language information, locale information, geolocation information, a number of calls for specific codeset converters, one or more predefined weight values for the codeset converters, and information associated with iconv profile information 118 (FIGS. 1A-1B). CCA 110 may optionally store the calculated codeset conversion weights is codeset converter weighting 122 for future use.

Figure 6:
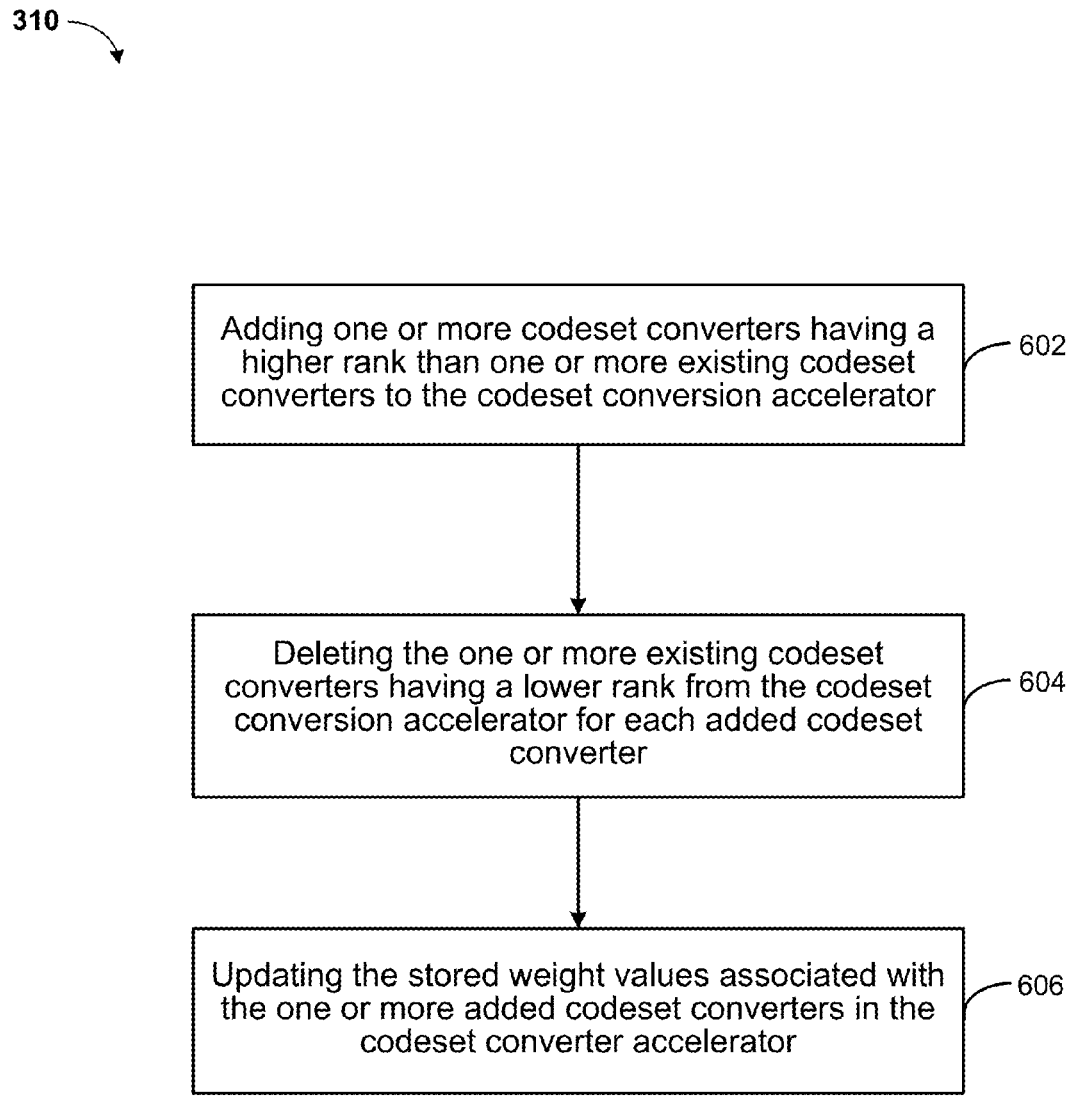
FIG. 6 is an operational flow chart corresponding to a reprogramming process utilized by a CCA program according to an exemplary embodiment.

FIG. 6 is an operational flow chart corresponding to a reprogramming process utilized by a CCA program according to an exemplary embodiment. FIG. 6 is described with the aid of the exemplary embodiments of FIG. 1A, FIG. 1B, and FIGS. 2A-2C.

At 602, one or more codeset converters having a higher rank than one or more existing codeset converters is added to the codeset converter accelerator. In operation, server 102 (FIG. 2B) may determine that Codeset Converters D and E (FIG. 2B) from among codeset converter library 120 (FIG. 2B) may have, among other things, a higher ranking than Codeset Converters B and C (FIG. 2B) from codeset conversion acceleration appliance 204 (FIG. 2B). Server 102 may accordingly direct selective accelerator reprogramming daemon 116 (FIGS. 1A-1B) to add Codeset Converters D and E to codeset conversion acceleration appliance 204. Additionally, server 102 may further determine that Codeset Converter A from among codeset converter library 120 is substantially the same or similar to Codeset Converter A from codeset conversion acceleration appliance 204. Server 102 may then restrict the addition of a second copy of Codeset Converter A to codeset conversion acceleration appliance 204.

At 604, the one or more existing codeset converters having a lower rank than the one or more added codeset converters is deleted from the codeset conversion accelerator. The codeset conversion accelerator may have limited space for codeset converters, and it may be, among other things, impractical to store a library of thousands of codeset converters on a codeset conversion accelerator. Thus, one or more existing codeset converters may be deleted from the codeset converter accelerator to allow space for one or more newly determined most-used codeset converters. In operation, CCA 110 (FIGS. 2B-2C) may direct codeset conversion acceleration appliance 204 (FIGS. 2B-2C) to delete, for example, Codeset Converters B and C (FIGS. 2B-2C) to allow space for Codeset Converters D and E (FIGS. 2B-2C) to be programmed to codeset conversion acceleration appliance 204. It may be appreciated, however, that an existing codeset converter may not need to be deleted from codeset conversion acceleration appliance 204 if codeset conversion acceleration appliance 204 has enough memory to store the additional codeset converters. For example, Codeset Converters B and C may use single byte-characters as opposed to, among other things, double-byte characters, thereby allowing space for Codeset Converters D and E on codeset conversion acceleration appliance 204.

At 606, the stored weight values associated with the one or more added codeset converters in the codeset conversion accelerator are updated. The calculated weight values for the one or more codeset converters may be stored for future comparison. In particular, the weight values for the one or more codeset converters programmed to the codeset converter accelerator may be stored to determine the subset of codeset converters from among the library of codeset converters to add to the codeset conversion accelerator and the one or more codeset converters to delete from the codeset conversion accelerator. In operation, CCA 110 (FIGS. 2A-2C) may save the weight values calculated by CCM weight algorithm 126 (FIGS. 1A-1B) to codeset converter weighting 122 (FIGS. 1A-1B). CCM weight algorithm 126 may subsequently use the one or more weight values saved to codeset converter weighting 122 to, among other things, calculate one or more new weight values for the codeset converter library 120 (FIGS. 2A-2C).

Figure 7:
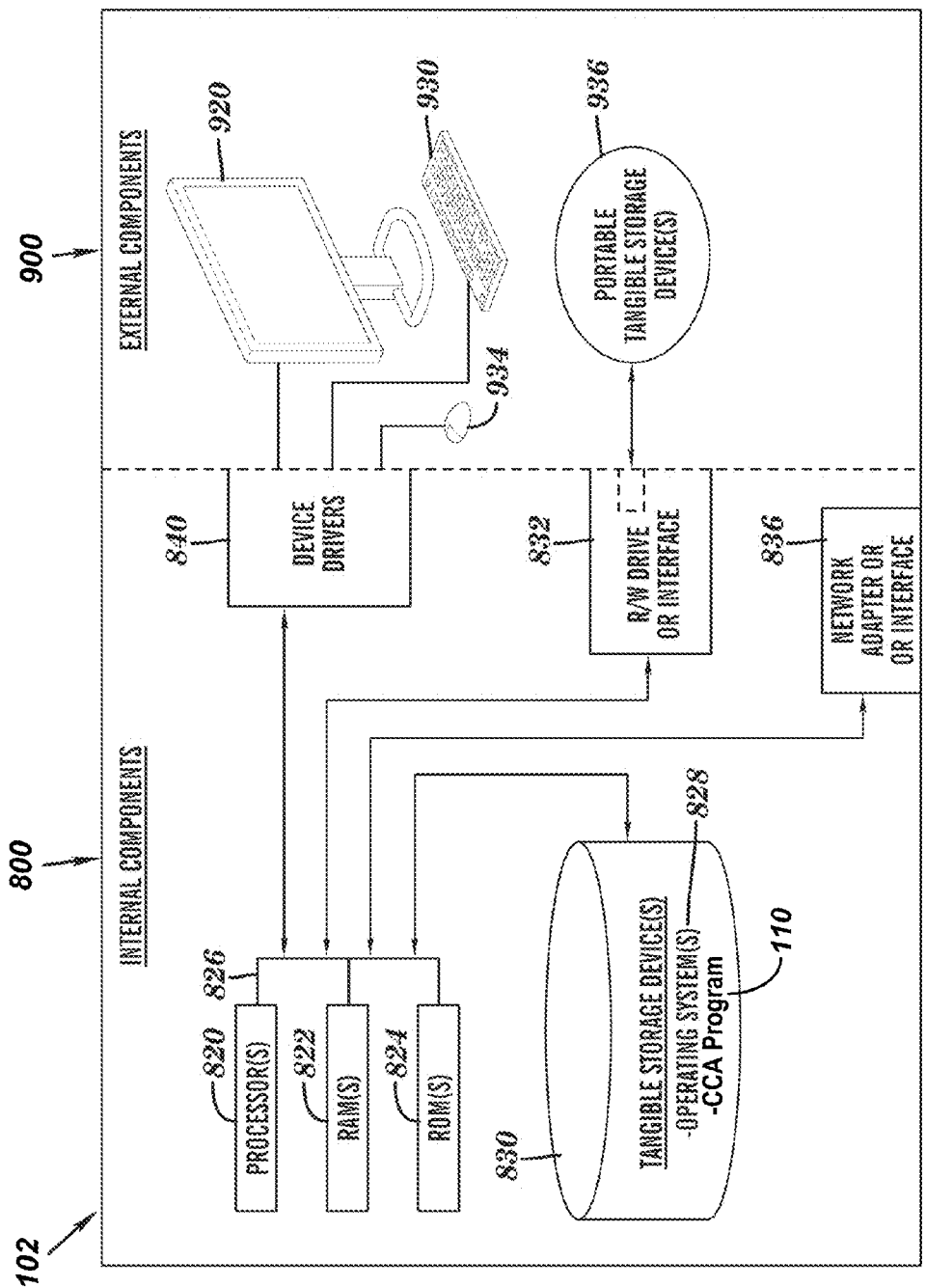
FIG. 7 is a block diagram of hardware and software for executing the process flows of FIGS. 3-6 according to an exemplary embodiment.

FIG. 7 shows a block diagram of the components of a data processing system 800, 900, that may be incorporated within server 102 (FIGS. 1A, 1B) in accordance with an illustrative embodiment of the present invention. It should be appreciated that FIG. 7 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The data processing system 800, 900 may include may include a set of internal components 800 and a set of external components 900 illustrated in FIG. 6. The set of internal components 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs such as Codeset Conversion Acceleration (CCA) 110 is stored on one or more computer-readable tangible storage devices 830 for execution by one or more processors 820 via one or more RAMs 822 (which typically include cache memory). In the embodiment illustrated in FIG. 6, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

The set of internal components 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. CCA 110 can be stored on one or more of the respective portable computer-readable tangible storage devices 936, read via the respective R/W drive or interface 832 and loaded into the respective hard drive 830.

The set of internal components 800 may also include network adapters (or switch port cards) or interfaces 836 such as a TCP/IP adapter cards, wireless wi-fi interface cards, or 3G or 4G wireless interface cards or other wired or wireless communication links. CCA program 110 can be downloaded from an external computer (e.g., server) via a network (for example, the Internet, a local area network or other, wide area network) and respective network adapters or interfaces 836. From the network adapters (or switch port adaptors) or interfaces 836, the CCA program 110 is loaded into the respective hard drive 830. The network may comprise copper wires, optical fibers, wireless transmission, routers, firewalls, switches, gateway computers and/or edge servers.

The set of external components 900 can include a computer display monitor 920, a keyboard 930, and a computer mouse 934. External component 900 can also include touch screens, virtual keyboards, touch pads, pointing devices, and other human interface devices. The set of internal components 800 also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A processor-implemented method for accelerating codeset conversion, comprising:
   receiving, by a processor-implemented codeset conversion acceleration (CCA) component, one or more requests for codeset conversion;
   detecting, by the CCA, a change in the one or more received requests for codeset conversion;
   selecting, by the CCA, a subset of codeset converters associated with a library of codeset converters for inclusion in a codeset conversion accelerator in response to detecting the change;
   reprogramming, by a selective accelerator re-programming daemon of the CCA, the codeset conversion accelerator with the selected subset of codeset converters; and
   routing, by a codeset conversion switch agent of the CCA, the received requests to the codeset conversion accelerator.

2. The method of claim 1, wherein the codeset conversion accelerator comprises at least one of a graphics processing unit (GPU) and a field-programmable gate array (FPGA).

3. The method of claim 1, wherein the selecting the subset of codeset converters comprises:
   calculating one or more weight values for the library of codeset converters;
   sorting the library of codeset converters according to the one or more calculated weight values;
   comparing the calculated weight values of the one or more sorted codeset converters to one or more stored weight values associated with one or more codeset converters in the codeset converter accelerator; and
   determining a ranking for the library of codeset converters based on the compared weight values.

4. The method of claim 3, wherein the one or more weight values are calculated based on collecting data associated with the selected subset of codeset converters, the collected data comprising one or more of:
   a language associated with the one or more requests;
   a locale associated with the one or more requests;
   a geolocation associated with the one or more requests;
   a computer platform associated with the one or more requests;
   existing codeset converter usage associated with the one or more requests;
   a number of codeset conversion function calls associated with the one or more requests;
   an amount of codeset converter data associated with the one or more requests; and
   predefined weight values associated with the library of codeset converters.

5. The method of claim 3, wherein the reprogramming comprises:
   adding one or more codeset converters from among the selected subset of codeset converters to the codeset conversion accelerator based on the one or more codeset converters having a higher rank than one or more existing codeset converters in the codeset conversion accelerator;
   deleting the one or more existing codeset converters having a lower rank from the codeset conversion accelerator for each added codeset converter; and
   updating the stored weight values associated with the one or more added codeset converters in the codeset converter accelerator.

6. The method of claim 3, wherein the one or more weight values are configurable.

7. The method of claim 1, wherein the computing environment comprises an OpenPower architecture.

8. A computer program product for accelerating codeset conversion, comprising:
   a selective accelerator re-programming daemon (daemon) embodied on a non-transitory computer-readable medium, the daemon including program instructions executed by a processor of a computer, the program instructions comprising:
   program instructions to receive one or more requests for codeset conversion;
   program instructions to detect a change in the one or more received requests for codeset conversion;
   program instructions to select a subset of codeset converters associated with a library of codeset converters for inclusion in a codeset conversion accelerator in response to detecting the change;
   program instructions to reprogram the codeset conversion accelerator with the selected subset of codeset converters; and
   program instructions to reroute the received requests to the codeset conversion accelerator.

9. The computer program product of claim 8, wherein the codeset conversion accelerator comprises at least one of a graphics processing unit (GPU) and a field-programmable gate array (FPGA).

10. The computer program product of claim 8, wherein the instructions to select the subset of codeset converters comprises:
    instructions to calculate one or more weight values for the library of codeset converters;
    instructions to sort the library of codeset converters according to the one or more calculated weight values;
    instructions to compare the calculated weight values of the one or more sorted codeset converters to one or more stored weight values associated with one or more codeset converters in the codeset converter accelerator; and
    instructions to determine a ranking for the library of codeset converters based on the compared weight values.

11. The computer program product of claim 10, wherein the instructions to calculate the one or more weight values comprises instructions to collect data corresponding to at least one of:
    a language associated with the one or more requests;
    a locale associated with the one or more requests;
    a geolocation associated with the one or more requests;
    a computer platform associated with the one or more requests;
    existing codeset converter usage associated with the one or more requests;
    a number of codeset conversion function calls associated with the one or more requests;
    an amount of codeset converter data associated with the one or more requests; and
    predefined weight values associated with the library of codeset converters.

12. The computer program product of claim 10, wherein the instructions to reprogram comprises:
    instructions to add one or more codeset converters from among the selected subset of codeset converters to the codeset conversion accelerator based on the one or more codeset converters having a higher rank than one or more existing codeset converters in the codeset conversion accelerator;

instructions to delete the one or more existing codeset converters having a lower rank from the codeset conversion accelerator for each added codeset converter; and instructions to update the stored weight values associated with the one or more added codeset converters in the codeset converter accelerator.

13. The computer program product of claim 10, wherein the one or more weight values are configurable.

14. A computer system for accelerating codeset conversion comprising:

one or more processors of a computer, one or more non-transitory computer-readable media, and program instructions stored on at least one of the one or more non-transitory computer-readable media executed by at least one of the one or more processors of the computer, the program instructions comprising:

program instructions to receive one or more requests for codeset conversion;

program instructions to detect a change in the one or more received requests for codeset conversion;

program instructions to select a subset of codeset converters associated with a library of codeset converters for inclusion in a codeset conversion accelerator in response to detecting the change;

program instructions to reprogram the codeset conversion accelerator with the selected subset of codeset converters; and program instructions to route the received requests to the codeset conversion accelerator.

15. The computer system of claim 14, wherein the codeset conversion accelerator comprises at least one of a graphics processing unit (GPU) and a field-programmable gate array (FPGA).

16. The computer system of claim 14, wherein the program instructions to select the subset of codeset converters comprise:

program instructions to calculate one or more weight values for the library of codeset converters;

program instructions to sort the library of codeset converters according to the one or more calculated weight values;

program instructions to compare the calculated weight values of the one or more sorted codeset converters to one or more stored weight values associated with one or more codeset converters in the codeset converter accelerator; and program instructions to determine a ranking for the library of codeset converters based on the compared weight values.

17. The computer system of claim 16, wherein the program instructions to calculate the one or more weight values calculate based on collecting data associated with the selected subset of codeset converters, the collected data comprising one or more of:

a language associated with the one or more requests;
a locale associated with the one or more requests;
a geolocation associated with the one or more requests;
a computer platform associated with the one or more requests;
existing codeset converter usage associated with the one or more requests;
a number of codeset conversion function calls associated with the one or more requests;
an amount of codeset converter data associated with the one or more requests; and
predefined weight values associated with the library of codeset converters.

18. The computer system of claim 16, wherein the program instructions to reprogram comprise:

program instructions to add one or more codeset converters from among the selected subset of codeset converters to the codeset conversion accelerator based on the one or more codeset converters having a higher rank than one or more existing codeset converters in the codeset conversion accelerator;

program instructions to delete the one or more existing codeset converters having a lower rank from the codeset conversion accelerator for each added codeset converter; and program instructions to update the stored weight values associated with the one or more added codeset converters in the codeset converter accelerator.

19. The computer system of claim 16, wherein the one or more weight values are configurable.

20. The computer system of claim 14, wherein the computing environment comprises an OpenPower architecture.

* * * * *